United States Patent
Furman et al.

(10) Patent No.: US 10,482,001 B2
(45) Date of Patent: Nov. 19, 2019

(54) AUTOMATED DYNAMIC TEST CASE GENERATION

(71) Applicant: International Business Machines Corporation, Armonk, NY (US)

(72) Inventors: Deborah A. Furman, Staatsburg, NY (US); Anthony T. Sofia, Highland, NY (US)

(73) Assignee: International Business Machines Corporation, Armonk, NY (US)

(*) Notice: Subject to any disclaimer, the term of this patent is extended or adjusted under 35 U.S.C. 154(b) by 523 days.

(21) Appl. No.: 14/835,825

(22) Filed: Aug. 26, 2015

(65) Prior Publication Data

US 2016/0357661 A1 Dec. 8, 2016

Related U.S. Application Data

(63) Continuation of application No. 14/733,147, filed on Jun. 8, 2015, now Pat. No. 10,140,204.

(51) Int. Cl.
| | |
|---|---|
| *G06F 11/36* | (2006.01) |
| *G01R 31/3183* | (2006.01) |
| *G01R 31/44* | (2006.01) |
| *G01R 31/3193* | (2006.01) |

(52) U.S. Cl.
CPC .... *G06F 11/3664* (2013.01); *G01R 31/31835* (2013.01); *G01R 31/31937* (2013.01); *G01R 31/44* (2013.01); *G06F 11/3684* (2013.01); *G06F 11/3688* (2013.01)

(58) Field of Classification Search
CPC .................. G06F 11/3664; G01R 31/31835

USPC .................................................. 702/121, 123
See application file for complete search history.

(56) References Cited

U.S. PATENT DOCUMENTS

| | | |
|---|---|---|
| 5,577,255 A | 11/1996 | Roemer et al. |
| 6,353,904 B1 | 3/2002 | Le |
| 6,480,800 B1 | 11/2002 | Molyneaux et al. |
| 6,996,805 B2 | 2/2006 | Achlioptas et al. |
| 7,562,255 B2 | 7/2009 | El Far et al. |
| 7,685,571 B2 | 3/2010 | Schulte et al. |
| 8,046,746 B2 | 10/2011 | Tillmann et al. |
| 9,542,290 B1 | 1/2017 | Dusanapudi et al. |
| 2005/0097515 A1 | 5/2005 | Ribling |
| 2005/0160433 A1 | 7/2005 | Lambert et al. |
| 2006/0140125 A1 | 6/2006 | Ottinger et al. |
| 2006/0155498 A1 | 7/2006 | Dunsmore et al. |
| 2006/0229020 A1 | 10/2006 | Mlinarsky et al. |
| 2006/0277439 A1 | 12/2006 | Davia et al. |
| 2007/0074156 A1 | 3/2007 | Nelson et al. |

(Continued)

OTHER PUBLICATIONS

Klinger, Motti; "'Custom Generic' Test Programs for Reusable Test Systems—Methodology and Implementation Examples"; The 21st IEEE Convention of the Electrical and Electronic Engineers in Israel; Tel-Aviv, Israel; Apr. 11-12, 2000; pp. 154-159; IEEE.

(Continued)

*Primary Examiner* — Eman A Alkafawi
(74) *Attorney, Agent, or Firm* — Mark Bergner (57) ABSTRACT

Embodiments of the present invention provide systems and methods for generating a set of test cases using a base test program. The base test program may be used as both a functional drive and as a performance measuring test case. From the base test program, additional key and value pairs may be added to the base test program to force specific test scenarios.

17 Claims, 4 Drawing Sheets

(56) References Cited

U.S. PATENT DOCUMENTS

| | | |
|---|---|---|
| 2007/0101196 A1 | 5/2007 | Rogers et al. |
| 2008/0126867 A1 | 5/2008 | Pandarinathan et al. |
| 2008/0244524 A1 | 10/2008 | Kelso |
| 2009/0307763 A1* | 12/2009 | Rawlins ............... G06F 9/44505 726/5 |
| 2011/0035724 A1 | 2/2011 | Kettley et al. |
| 2012/0017232 A1 | 1/2012 | Hoffberg et al. |
| 2012/0192153 A1 | 7/2012 | Venkatraman et al. |
| 2012/0198280 A1 | 8/2012 | Cao et al. |
| 2012/0297145 A1* | 11/2012 | Castillo ............... G06F 12/0868 711/138 |
| 2012/0297251 A1 | 11/2012 | Masser et al. |
| 2013/0014089 A1 | 1/2013 | Precious et al. |
| 2013/0159975 A1 | 6/2013 | Hu et al. |
| 2013/0205119 A1 | 8/2013 | Rajwar et al. |
| 2013/0232474 A1 | 9/2013 | Leclair et al. |
| 2013/0254746 A1 | 9/2013 | Balakrishnan et al. |
| 2014/0019811 A1* | 1/2014 | Bordawekar ....... G06F 11/3409 714/47.1 |
| 2014/0040867 A1 | 2/2014 | Wefers et al. |
| 2014/0123109 A1 | 5/2014 | Goetz et al. |
| 2014/0164842 A1 | 6/2014 | Corfield |
| 2014/0173555 A1 | 6/2014 | Ng et al. |
| 2014/0215439 A1 | 7/2014 | Krishnan et al. |
| 2014/0245264 A1 | 8/2014 | Bartley et al. |
| 2014/0278198 A1* | 9/2014 | Lyon .................. G06Q 30/0201 702/121 |
| 2015/0143341 A1 | 5/2015 | Jerrard-Dunne et al. |
| 2015/0199188 A1 | 7/2015 | Mantripragada et al. |
| 2015/0220426 A1 | 8/2015 | Spektor et al. |
| 2015/0377967 A1 | 12/2015 | Thiruvengadam et al. |
| 2016/0014009 A1 | 1/2016 | Jain et al. |
| 2016/0140007 A1 | 5/2016 | Cho et al. |
| 2016/0154055 A1 | 6/2016 | Leibowitz et al. |
| 2016/0162381 A1 | 6/2016 | Hendrickson et al. |
| 2016/0356851 A1 | 12/2016 | Furman et al. |

OTHER PUBLICATIONS

U.S. Appl. No. 14/733,147, filed Jun. 8, 2015, Entitled "Automated Dynamic Test Case Generation", 22 pages.

Appendix P: List of IBM Patents or Patent Applications Treated as Related, dated Aug. 26, 2015, 2 pages.

* cited by examiner

AUTOMATED DYNAMIC TEST CASE GENERATION

BACKGROUND OF THE INVENTION

The present invention relates generally to the field of test programs, and more particularly to dynamic generation of a multi-use test program.

When designing test programs for a software system, a typical flow may be: study the design; define variations for specific aspects of the design; and then write individual test programs for each variation. The individual test programs may then make up a static regression bucket, which can be run against the product throughout the development of the software. Individual teams performing, for example, functional, system, and performance tests, often each have their own test programs, which may operate in different environments or at different volumes and velocities.

SUMMARY

According to one embodiment of the present invention, a method for generating test cases is provided, the method comprising: providing, by one or more processors, a base test, the base test configured to measure performance of an interface; adding, by one or more processors, to the base test, at least one identifier, wherein the at least one identifier is associated with a functional test variation; and generating, by one or more processors, a plurality of test cases from the base test, wherein the plurality of test cases comprise a set of aspects to be tested, based on the at least one identifier.

According to another embodiment of the present invention, a computer program product for generating test cases is provided, the computer program product comprising: a computer readable storage medium and program instructions stored on the computer readable storage medium, the program instructions comprising: program instructions to provide a base test, the base test configured to measure performance of an interface; program instructions to add, to the base test, at least one identifier, wherein the at least one identifier is associated with a functional test variation; and program instructions to generate a plurality of test cases from the base test, wherein the plurality of test cases comprise a set of aspects to be tested, based on the at least one identifier.

According to another embodiment of the present invention, a system for building a test program is provided, the system comprising: a base test, the base test configured to measure performance of an interface, and wherein the base test includes at least one identifier; a plurality of test cases, wherein the plurality of test cases are generated from the base test; and a feedback module, wherein the feedback module is configured to communicate with the base test.

DETAILED DESCRIPTION

Embodiments of the present invention provide automated systems and methods for designing and developing a multi-use test program that can be iteratively enhanced to provide test coverage across both functional testing, as well as environmental and interaction testing, using key and value pairs. The method of the present invention moves from the end of the test cycle (i.e., performance measurement testing) to the beginning of the test cycle (i.e., unit and functional testing).

Figure 1:
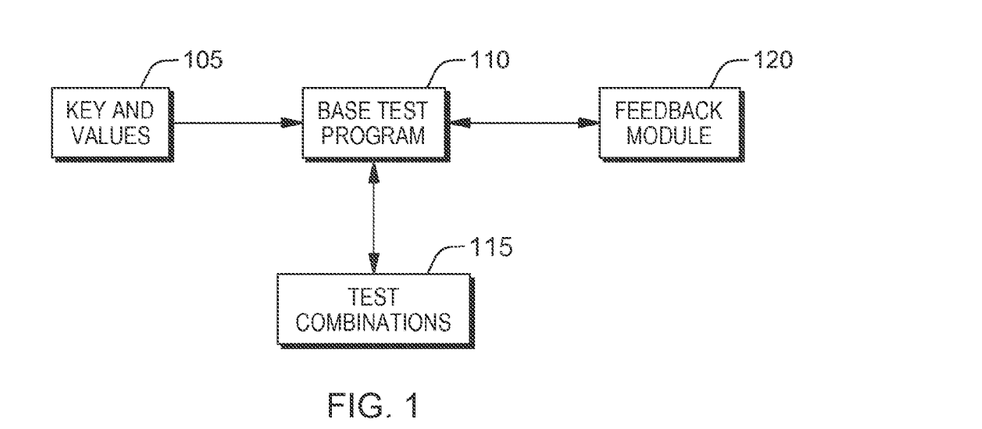
FIG. 1 is a functional block diagram illustrating an automated test generation environment, in accordance with an embodiment of the present invention.

The present invention will now be described in detail with reference to the Figures. FIG. 1 is a functional block diagram illustrating an automated test generation environment, generally designated 100, in accordance with an embodiment of the present invention. Modifications to automated test generation environment 100 may be made by those skilled in the art without departing from the scope of the invention as recited by the claims. In an exemplary embodiment, automated test generation environment 100 includes key and values 105, base test program 110, test combinations 115, and feedback module 120.

Key and values 105 are unique identifiers for various items of data, and point to a location of an item of data. In this exemplary embodiment, key and values 105 are added to base test program 110 for designing specific functional, environmental, and/or interaction tests.

In this exemplary embodiment, base test program 110 is a single test program which can support multiple options, and which can understand the interaction between various options to either exclude the execution of them in test combinations 115, or to allow the execution of them and then validate any generated errors. Base test program 110 provides all environments and paths which are targeted to be exercised, and which can be enabled via key and values 105. Base test program 110 uses a descriptive language for setting options. Base test program 110 takes key and values 105 and generates every possible combination for testing, and then executes each testing combination. For example, for combinatorial API testing, base test program 110 is capable of dynamically and efficiently generating test programs for all levels of testing.

Test combinations 115 are all combinations created from feeding key and values 105 into base test program 110. In some embodiments, an existing combinatorial test tool is used to generate all of the combinations for base test program 110.

Feedback module 120 is the mechanism by which base test program 110 reports on the test combinations 115 provided, during execution. For example, feedback module 120 may store a list of automatically generated test combinations which will not execute, and thus base test program 110 will not implement these combinations in future test case generations.

Figure 2A:
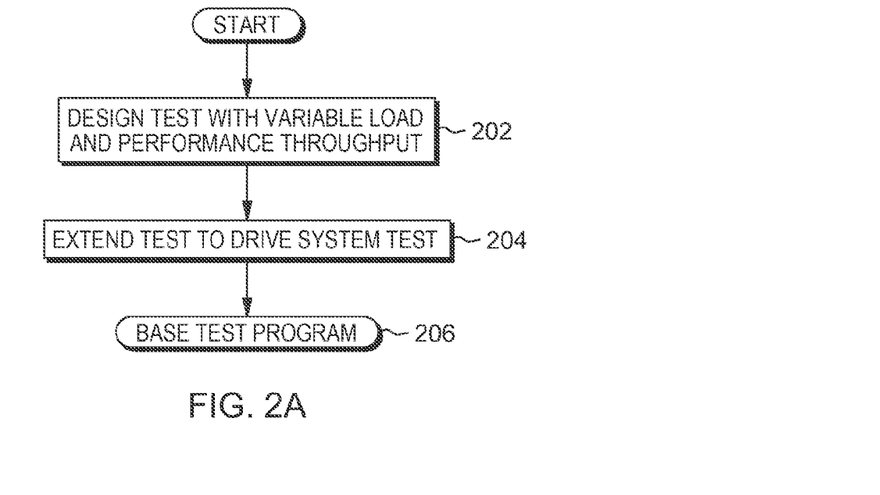
FIG. 2A is a flowchart illustrating operational steps for designing a base test program, in accordance with an embodiment of the present invention.

FIG. 2A is a flowchart illustrating operational steps for designing a base test program, in accordance with an embodiment of the present invention.

In step 202, the base test program is designed with a variable load and performance throughput. In this exemplary embodiment, the base test program is designed such that it is able to drive a variable amount of load for performance testing throughput. Some examples of key and values which may be introduced into the design at this stage include: iterations (i.e., how many times the functions should be called), request size (i.e., allow a variable size request to be tuned if function takes in a variable size request), and request delay (i.e., allow for a delay between requests, if any). Introducing these key and values designs a base test program which can be used for both measuring the throughput of calls over a period of time, as well as, providing consistent load using the new functions with a static set of parameters. The ability to report on metrics, such as CPU consumption, elapsed time for the set of requests, and other related performance metrics, is also introduced at this stage in the design.

In step 204, the test program is extended to drive a system test. In this exemplary embodiment, the key and values of duration (i.e., how long program execution lasts) and tasks (i.e., how much multi-tasking should be performed). The key and value of duration overrides the key and value of iterations from step 202.

Accordingly, by performing the operational steps of FIG. 2A, base test program 206 is designed, with the ability to drive parallel load over an extended period of time. The base test program 206 options provide API options, as well as the number of requests, so that the same base test program can be used as a functional driver and as a performance measuring test case and a system thrasher, which makes limit testing and exhaustion of resource testing easier.

Figure 2B:
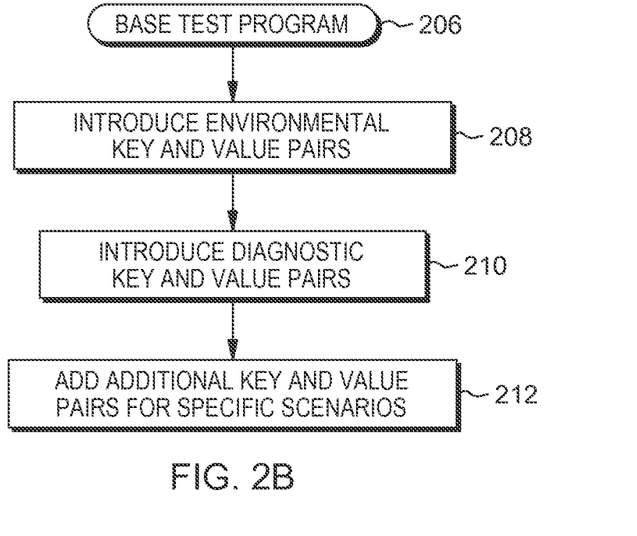
FIG. 2B is a flowchart illustrating operational steps for introducing a set of variables for different environments to the base test program, in accordance with an embodiment of the present invention.

FIG. 2B is a flowchart illustrating operational steps for introducing a set of variables for different environments to the base test program, in accordance with an embodiment of the present invention. Multiple key and value pairs may be iteratively introduced to the created base test program 206 for different environmental issues to handle function test type variations.

In step 208, environmental key and value pairs are introduced to base test program 206. For example, the key and value pairs task type (i.e., what kind of tasks are requested to be used) and recovery (i.e., which support recovery environments should be established before calling the functions to be tested) may be introduced.

In step 210, diagnostic key and value pairs are introduced to enable tracing or enhanced diagnostic capturing when errors occur. At this point in the design process, a load can be generated and performance impacts can be measured.

In step 212, additional functional key and value pairs can be added that are specific for the functions being tested. For example, functional interaction and purposeful error injection may be key and value pairs to be added for functional testing. As new options are added, the set of specific test programs can be regenerated. Additionally, when the test program encounters an error during execution (e.g., will not perform any execution), the test program dynamically adds itself to an exclusion list so that that particular program combination does not run again in future executions.

Accordingly, by performing the operational steps of FIG. 2B, a means for generating all of the specific test cases on the fly is created, without having to store the large volume of test cases for a specific testing scenario. It is possible for many unit tests to be driven using the designed test program. Additional key and value pairs may be added to the test program to force specific test scenarios without interfering with existing test combinations, and new test programs for product servicing or future development may be easily created, as new options may be easily implemented with the base test program.

FIGS. 3A-D depict examples of the base test program at the functional testing level, in accordance with an embodiment of the present invention.

Figure 3A:
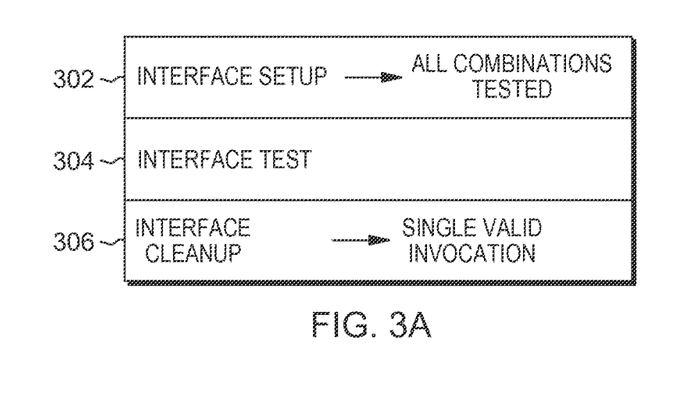
FIGS. 3A-D depict examples of the base test program at the functional testing level, in accordance with an embodiment of the present invention.

FIG. 3A depicts an example of a base test program written to test interface setup 302. In this exemplary embodiment, three example phases are shown, interface setup 302, interface test 304, and interface cleanup 306. In this example, the key and value pairs are used to test 'all combinations tested' for interface setup 302, and only the basic test execution is exercised by the key and value pairs (i.e., no calls to test any actual interfaces or test the cleanup are used).

Figure 3B:
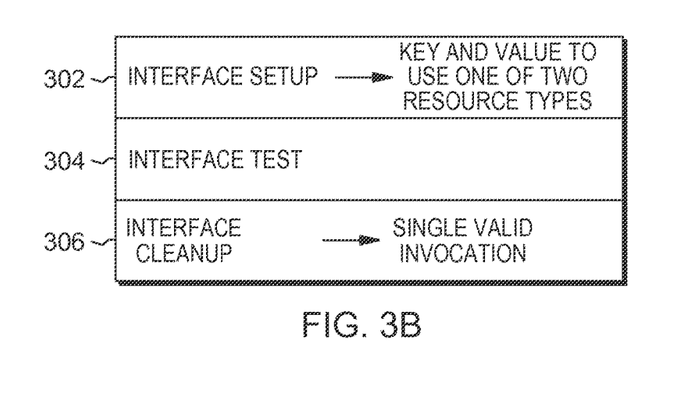

FIG. 3B depicts an example of adding a first key and value to the base test program of FIG. 3A, in accordance with an embodiment of the present invention. In this example, the first key and value dictates one of two types of resources which can be obtained for the setup of the interface calls. As depicted, a 'key and value to use one of two resource types' is associated with interface setup 302. For example, if the environment key and value has two values, then a set of two test cases are created and executed, such as specifying a store type in which the storage used for this test may be either (i) 64 bits or (ii) 31 bits.

Figure 3C:
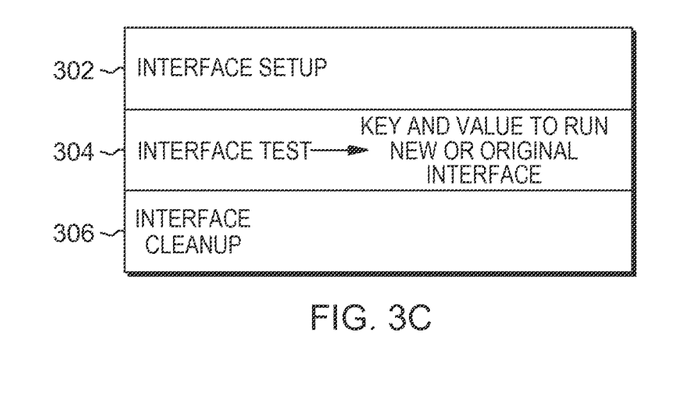

FIG. 3C depicts an example of adding a second key and value to the base test program of FIG. 3B, in accordance with an embodiment of the present invention. In this example, the base test program is amended with an additional key and value (i.e., 'key and value to run new or original interface') for the second interface (i.e., interface test 304). After the key and value is added, there are a total of two key and values for the interface (added in FIG. 3C) and two key and values for the environment (added in FIG. 3B), which produce four automatically generated test cases in total.

Figure 3D:
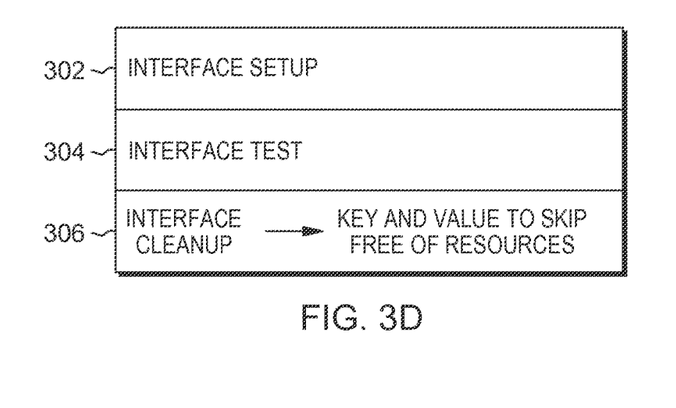

FIG. 3D depicts an example of adding a third key and value to the base test program of FIG. 3C, in accordance with an embodiment of the present invention. In this example, a new key and value may be added to interface cleanup 306 (i.e., 'key and value to skip free of resources'), to account for a caller not performing explicit interface cleanup. This key and value produces an additional two combinations to the base test program, which leads to a total of eight automated test cases being generated for all three added key and values (i.e., one key and value pair added to each of FIGS. 3B-3D). As this is a part of a larger test program driver, all of the added options are able to be driven in multi-threaded and high load environments.

Figure 4:
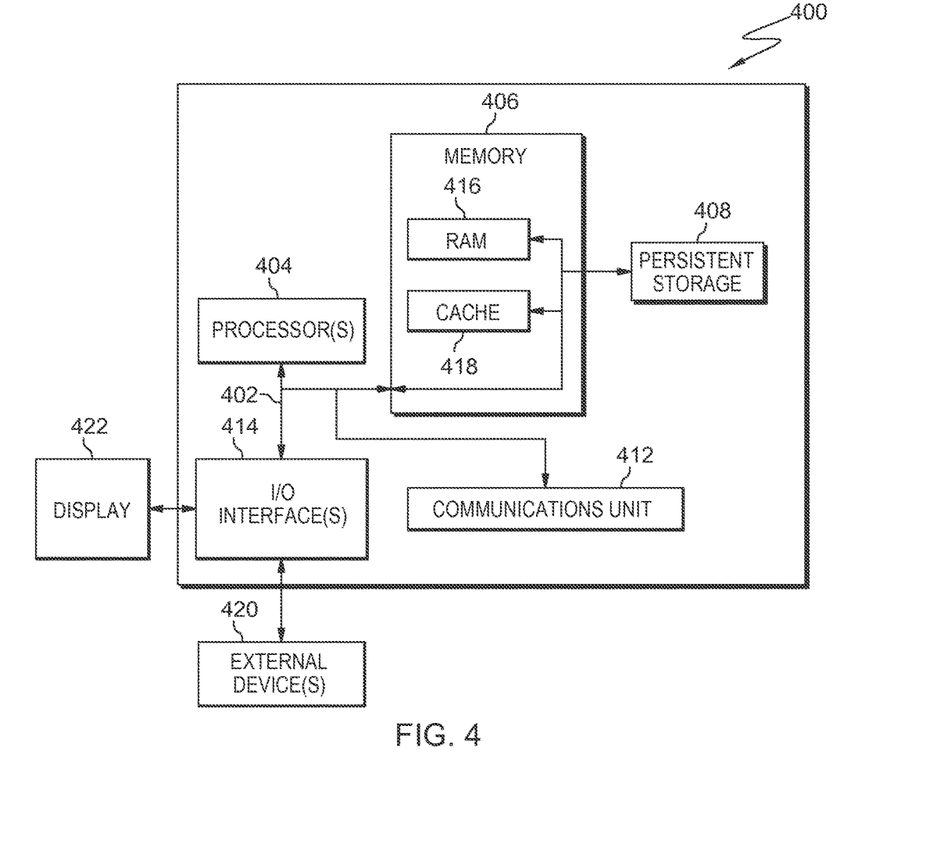
FIG. 4 is a block diagram of internal and external components of a computing device, in accordance with an embodiment of the present invention.

FIG. 4 is a block diagram of internal and external components of a computer system 400, in accordance with an embodiment of the present invention. It should be appreciated that FIG. 4 provides only an illustration of one implementation and does not imply any limitations with regard to the environments in which different embodiments may be implemented. In general, the components illustrated in FIG. 4 are representative of any electronic device capable of executing machine-readable program instructions. Examples of computer systems, environments, and/or configurations that may be represented by the components illustrated in FIG. 4 include, but are not limited to, personal computer systems, server computer systems, thin clients, thick clients, laptop computer systems, tablet computer systems, cellular telephones (e.g., smart phones), multiprocessor systems, microprocessor-based systems, network PCs, minicomputer systems, mainframe computer systems, and distributed cloud computing environments that include any of the above systems or devices.

Computer system 400 includes communications fabric 402, which provides for communications between one or more processors 404, memory 406, persistent storage 408, communications unit 412, and one or more input/output (I/O) interfaces 414. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer readable storage media. In this embodiment, memory 406 includes random access memory (RAM) 416 and cache memory 418. In general, memory 406 can include any suitable volatile or non-volatile computer readable storage media. Software is stored in persistent storage 408 for execution and/or access by one or more of the respective processors 404 via one or more memories of memory 406.

Persistent storage 408 may include, for example, a plurality of magnetic hard disk drives. Alternatively, or in addition to magnetic hard disk drives, persistent storage 408 can include one or more solid state hard drives, semiconductor storage devices, read-only memories (ROM), erasable programmable read-only memories (EPROM), flash memories, or any other computer readable storage media that is capable of storing program instructions or digital information.

The media used by persistent storage 408 can also be removable. For example, a removable hard drive can be used for persistent storage 408. Other examples include optical and magnetic disks, thumb drives, and smart cards that are inserted into a drive for transfer onto another computer-readable storage medium that is also part of persistent storage 408.

Communications unit 412 provides for communications with other computer systems or devices via a network. In this exemplary embodiment, communications unit 412 includes network adapters or interfaces such as a TCP/IP adapter cards, wireless Wi-Fi interface cards, or 3G or 4G wireless interface cards or other wired or wireless communication links. The network can comprise, for example, copper wires, optical fibers, wireless transmission, routers, firewalls, switches, gateway computers and/or edge servers. Software and data used to practice embodiments of the present invention can be downloaded to computer system 400 through communications unit 412 (e.g., via the Internet, a local area network or other wide area network). From communications unit 412, the software and data can be loaded onto persistent storage 408.

One or more I/O interfaces 414 allow for input and output of data with other devices that may be connected to computer system 400. For example, I/O interface 414 can provide a connection to one or more external devices 420 such as a keyboard, computer mouse, touch screen, virtual keyboard, touch pad, pointing device, or other human interface devices. External devices 420 can also include portable computer readable storage media such as, for example, thumb drives, portable optical or magnetic disks, and memory cards. I/O interface 414 also connects to display 422.

Display 422 provides a mechanism to display data to a user and can be, for example, a computer monitor. Display 422 can also be an incorporated display and may function as a touch screen, such as a built-in display of a tablet computer.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for dynamically generating automatic computer generated test cases, the method comprising, performing on a processor:
    testing a software interface in a plurality of phases of an interface test, wherein the plurality of phases comprises a first phase and a second phase;
    providing, as a part of the interface test, a base test, the base test configured to measure performance of the software interface, wherein the base test is designed to drive a variable amount of load for performance throughput;
    for the plurality of phases, adding, to the base test, a plurality of key and value pairs, wherein the plurality of key and value pairs are associated with functional test variations related to the interface test;
    generating a plurality of test cases from the base test, wherein the plurality of test cases comprises a set of aspects to be tested, the plurality of test cases covering each of the plurality of phases;
    executing the plurality of test case;
    for the first phase, adding, to the base test, a first key and value pair of the plurality of key and value pairs that are associated with a functional test variation related to an environment of the interface test; and
    for the second phase, adding, to the base test, a second key and value pair of the plurality of key and value pairs that are associated with a functional test variation related to an actual test of the interface.

2. The method of claim 1, wherein at least one of the plurality of key and value pairs is configured to enable tracing.

3. The method of claim 1, wherein at least one of the plurality of key and value pairs is configured to capture diagnostics, responsive to detecting an error.

4. The method of claim 1, wherein at least one of the plurality of key and value pairs comprises at least one of: a type of task, a recovery environment, a functional interaction, or an error injection.

5. The method of claim 1, further comprising:
    modifying the base test to introduce interactions between one or more tested interfaces.

6. The method of claim 1, the method further comprising:
    reporting, by the base test and during execution, an automatically generated test combination that does not execute; and
    storing a list of that includes each automatically generated test combination that has been reported.

7. The method of claim 1, further comprising:
    introducing, iteratively, an environmental key and value pair as one of the plurality of key and value pairs, wherein the introduced environmental key and value pair determines which kind of tasks are requested to be used and which support recovery environments are to be established before calling one or more functions to be tested;
    regenerating a set of specific test programs responsive to introducing additional functional key and value pairs that are specific for a particular type of associated function being tested;
    extending the base test to drive a system test that tracks a duration of how long a program execution lasts and an amount of how much multi-tasking should be performed, wherein the extended duration overrides one or more key and value pairs of prior iterations; and utilizing the base test as a functional driver, as a performance measuring test, and as a system thrasher.

8. The method of claim 1, wherein each test case of the plurality of test cases corresponds to a unique combination of key and value pairs.

9. The method of claim 5, wherein at least one of the key and value pairs is selected from a group consisting of a number of times a particular function is to be called, a variable size request for the particular function, a request delay, and a program execution duration.

10. The method of claim 1, further comprising:
introducing, iteratively, an environmental key and value pair as one of the plurality of key and value pairs, wherein the introduced environmental key and value pair determines which kind of tasks are requested to be used and which support recovery environments are to be established before calling one or more functions to be tested.

11. The method of claim 7, further comprising: regenerating a set of specific test programs responsive to introducing additional functional key and value pairs that are specific for a particular type of associated function being tested.

12. The method of claim 7, further comprising: extending the base test to drive a system test that tracks a duration of how long a program execution lasts and an amount of how much multi-tasking should be performed, wherein the extended duration overrides one or more identifiers key and value pairs of prior iterations.

13. The method of claim 1, further comprising:
utilizing the base test as a functional driver, as a performance measuring test, and as a system thrasher.

14. The method of claim 1, further comprising:
receiving feedback from the testing system; and
adding, dynamically, a particular program combination of the base test to an exclusion list such that the particular program combination does not run again in future executions responsive to encountering feedback comprising an error during execution.

15. The method of claim 1, wherein:
the first phase is a setup phase;
the second phase is a test phase; and
the plurality of phases further comprises an interface cleanup phase.

16. The method of claim 12, wherein: for the interface cleanup phase, adding, to the base test, a third key and value pair of the plurality of key and value pairs that is associated with a functional test variation related to interface cleanup.

17. The method of claim 13, wherein the plurality of test cases has a variation count that reflects a total number of combinations of environment key values, actual test key values, and interface cleanup key values.

* * * * *